United States Patent
Hsu (10) Patent No.: US 6,861,740 B2
(45) Date of Patent: Mar. 1, 2005

(54) FLIP-CHIP DIE AND FLIP-CHIP PACKAGE SUBSTRATE

(75) Inventor: Chi-Hsing Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/709,265

(22) Filed: Apr. 26, 2004

(65) Prior Publication Data

US 2004/0188856 A1 Sep. 30, 2004

Related U.S. Application Data

(62) Division of application No. 10/064,062, filed on Jun. 6, 2002, now abandoned.

(30) Foreign Application Priority Data

Apr. 29, 2002 (TW) ...................................... 91205886 U (51) Int. Cl.[7] .............................................. H01L 23/52
(52) U.S. Cl. ...................... 257/691; 257/778; 257/779; 257/780; 257/773; 257/774; 257/700
(58) Field of Search .......................... 257/691, 778–780, 257/773–774, 700

(56) References Cited

U.S. PATENT DOCUMENTS 6,479,758 B1 * 11/2002 Arima et al. ............... 174/260

* cited by examiner

Primary Examiner—Luan Thai
(74) Attorney, Agent, or Firm—Jiang Chyun IP Office (57) ABSTRACT

A flip-chip die and a flip-chip package substrate. The flip-chip die has an active surface containing a plurality of core power/ground pads, at least one signal pad rings, at least one power pad rings and at least one ground pad rings. The core power/ground pads are located in the central region of the die while the die pad rings are arranged concentrically just outside the central power/ground pad occupied region. The uppermost layer of the flip-chip package substrate has a plurality of bump pads that correspond to the die pads on the die. Non-signal bump pad rings may also form outside the signal bump pad ring. Pairs of power trace or ground trace may also form on the sides of a signal trace in any one of the wiring layers within the flip-chip package substrate to serve as guard traces for the signal trace.

22 Claims, 11 Drawing Sheets

FLIP-CHIP DIE AND FLIP-CHIP PACKAGE SUBSTRATE

CROSS REFERENCE TO RELATED APPLICATIONS

This application is a divisional of a prior application Ser. No. 10/064,062, filed Jun. 6, 2002, now abandoned, which claims the priority benefit of Taiwan application serial no. 91205886, filed Apr. 29, 2002.

BACKGROUND OF INVENTION

1. Field of Invention

The present invention relates to a flip-chip die and a flip-chip package substrate. More particularly, the present invention relates to a flip-chip die having a plurality of die pad rings and a flip-chip package substrate having a plurality of bump pad rings that corresponds to the flip-chip die.

2. Description of Related Art

Flip-chip (FC) bonding is a common type of packaging technique in a chip scale package (CSP). To form a flip-chip package, an array of die pads is formed on the active surface of a die. Thereafter, a bump is formed over each die pad. Finally, the bumps are attached to corresponding contacts on a carrier. In other words, the die is flipped over and bonded with the contacts on the carrier surface.

Due the various advantages such as an overall reduction in package area, an increase in package density and shortening of signal transmission paths, flip-chip bonding technique has been widely adopted in die packaging. This is especially true for high-pin-count package structures such as a ball grid array or a pin grid array. The idea of forming a high-pin-count package under a flip-chip configuration has lead to the manufacturing of flip-chip ball grid array (FCBGA) and flip-chip pin grid array (FCPGA) with each die containing a few hundred bonding pads.

In general, all flip-chip packages including the FCBGA and the FCPGA have a substrate. The substrate serves as a carrier for joining with a die. Each substrate comprises of a plurality of alternately stacked wiring layers and insulation layers. Each insulation layer has a plurality of through plugs for connecting neighboring wiring layers electrically. In addition, the upper surface of the substrate has a plurality of bump pads. Each bump pad connects to a corresponding bump on a die. The bottom surface of the substrate has a plurality of ball pads that connect electrically to the bump pads through internal circuits. A conductive structure such as a solder ball may be attached to each ball pad for connecting to the next level of electronic device such as a printed circuit board (PCB).

Figure 1:
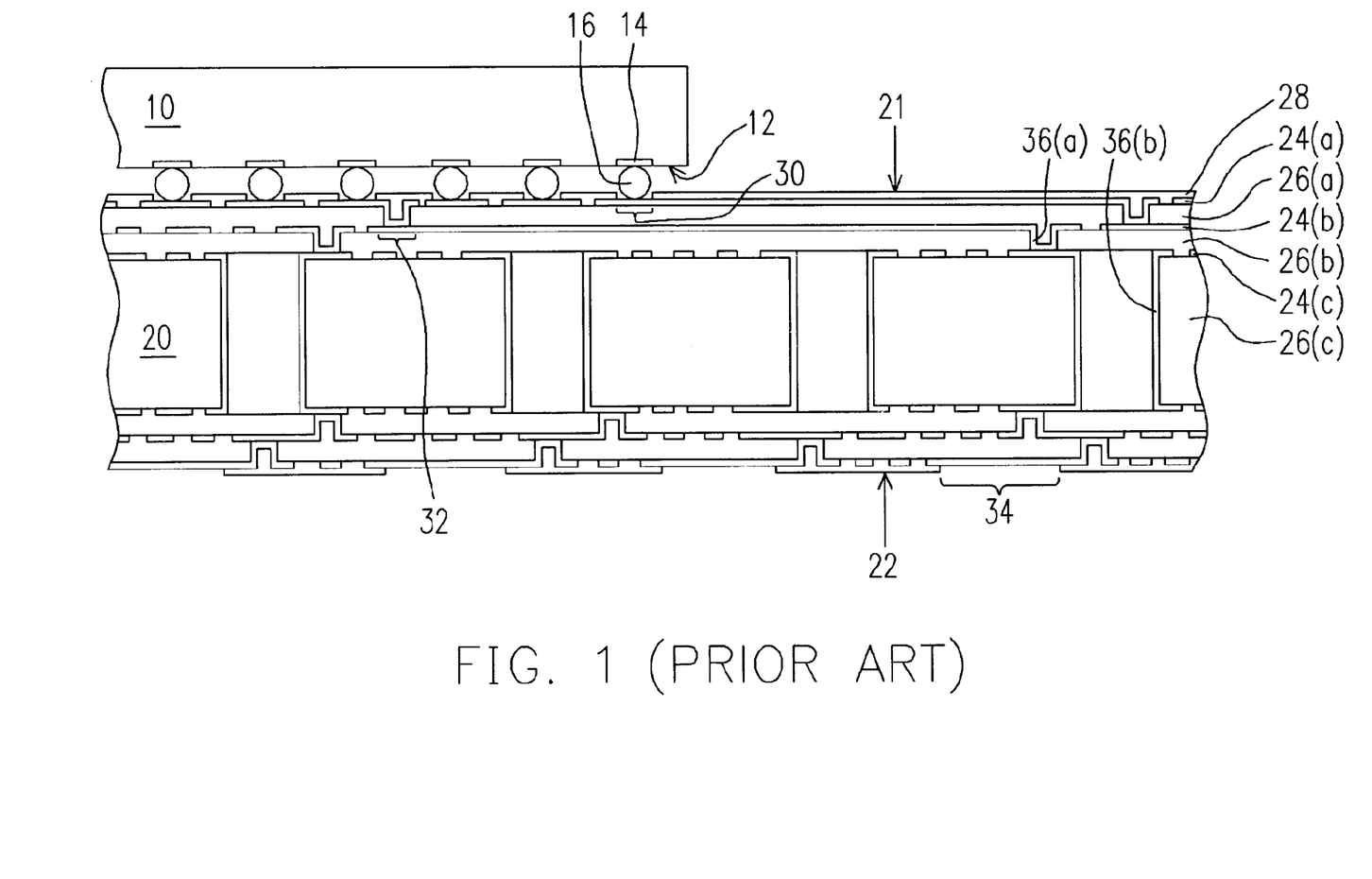
FIG. 1 is a sectional view of a portion of a conventional flip-chip package structure.

FIG. 1 is a sectional view of a portion of a conventional flip-chip package structure. As shown in FIG. 1, the package includes a die 10 having an active surface 12. The active surface 12 of the die 10 has an array of pads 14 thereon. The package also includes a flip-chip package substrate 20 that comprises of a plurality of wiring layers 24 (such as 24a, 24b, 24c . . . ) and a plurality of insulation layers 26 (such as 26a, 26b, 26c). The wiring layers 24 and the insulation layers 26 are alternately stacked one over the other. A plurality of through plugs 36 inside the insulation layer 26 connects the respective wiring layers 24 electrically. In general, two types of plugs 36 are generally used, a via plug 36a and a plating through hole (PTH) 36b. These two types of plugs are fabricated according to dimensional requirements.

The uppermost wiring layer 24 (the one closest to the uppermost surface 21 of the substrate 20) is a first wiring layer 24a. The first wiring layer 24a has a plurality of bump pads 30. Each bump pad 30 corresponds in position to a die pad 14 so that the die pad 14 and the bump pad 30 on the substrate 20 are electrically connected through a bump 16. Ultimately, through the wiring layers 24 and plugs 36, a portion of the die pads 14 on the die 10 fans out to areas underneath the active surface 12. The substrate 20 further includes a patterned solder mask 28 over the first insulation layer 26a and the first wiring layer 24a while exposing the plurality of bump pads 30 on the first wiring layer 24a. The solder mask 28 protects the first wiring layer 24a and the first insulation layer 26a. In addition, the bottom surface 22 of the substrate 20 has a plurality of ball pads 34 for connecting with the next level of electronic device through an electrical structure such as a solder ball (not shown).

Figure 2A:
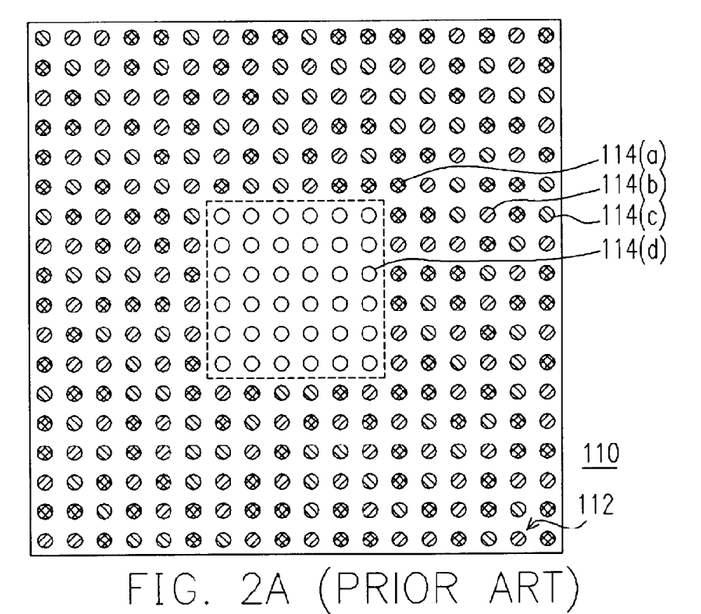
FIG. 2A is a top view of the die in FIG. 1.

FIG. 2A is a top view of the die in FIG. 1. The active surface 112 of the die 110 has a plurality of die pads 114 (such as 114a, 114b, 114c, 114d, . . . ) configured as an area array. According to their respective functions, the die pads 114 are divided into signal pads 114a, power pads 114b, ground pads 114c and core power/ground pads 114d. The signal pads 114a, the power pads 114b and the ground pads 114c surround the core power/ground pads 114d. Note that the signal pads 114a, the power pads 114b and the ground pads 114c are randomly distributed over the active surface 112 of the die 110 by convention. Hence, when the original die pads (not shown) on the die 110 is re-distributed to the active surface 112 of the die pad through a re-distribution layer (RDL), overall path length to the re-distributed die pad 114 will increase. Since signal transmission pathway is increased, electrical performance of the die 110 is compromised.

Figure 2B:
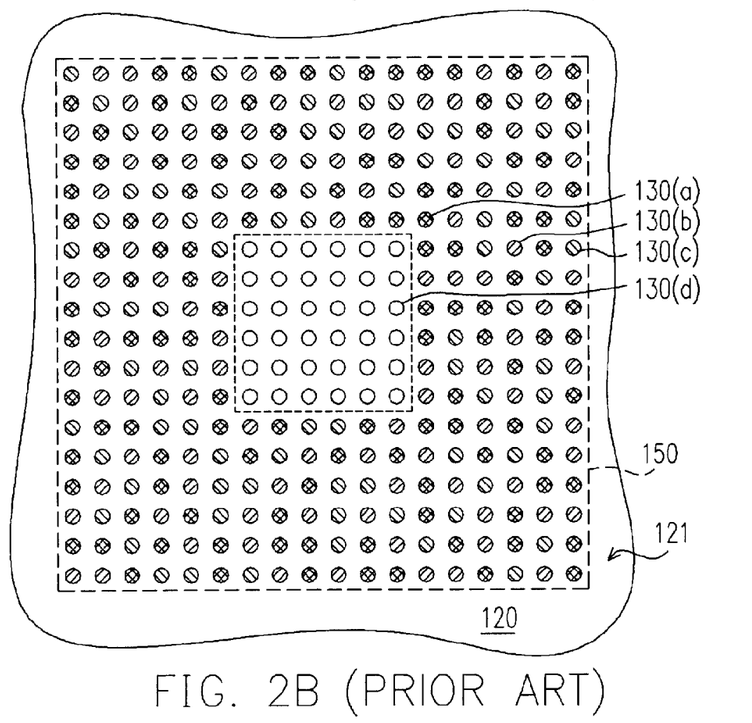
FIG. 2B is a top view of a portion of a flip-chip package substrate that corresponds to the die in FIG. 2A.

FIG. 2B is a top view of a portion of a flip-chip package substrate that corresponds to the die in FIG. 2A. As shown in FIG. 2B, the upper surface 121 of the flip-chip package substrate 120 has a plurality of bump pads 130 thereon (such as 130a, 130b, 130c, 130d, . . . ). All bump pads 130 are formed inside the die area 140 of the flip-chip package substrate 120 and positioned into an area array so that each bump pad 130 lies over a die pads 114 as shown in FIG. 2A. To link up with the signal pads 114a, the power pads 114b, ground pads 114c and core power/ground pads 114d on the die 110, the bump pads 130 on the substrate 120 may be similarly divided into signal bump pads 130a, power bump pads 130b, ground bump pads 130c and core power/ground bump pads 130d. The signal bump pads 130a, the power bump pads 130b and the ground bump pads 130c surround the core power/ground bump pads. Note that the signal pads 114a, the power pads 114b and the ground pads 114c are randomly distributed over the active surface 112 of the die 110 by convention. Hence, the signal bump pads 130a, the power bump pads 130b and the ground bump pads 130c are also randomly distributed over the upper surface 121 of the substrate 120.

SUMMARY OF INVENTION

Accordingly, one object of the present invention is to provide a flip-chip die capable of shortening overall length of wiring inside the flip-chip die. Hence, overall wiring length of the re-distribution layer inside the flip-chip die is reduced and electrical performance of the die is improved. In addition, power pads and ground pads within the die are more centrally distributed. Aside from facilitating wiring layout, this arrangement also provides a uniform reference power and ground voltage to related signal groups. Ultimately, electrical performance of the die is similarly improved.

A second object of this invention is to provide a flip-chip package substrate having bump pads thereon that correspond in position to the die pads on the flip-chip die. Similarly, the power bump pads and ground bump pads are centrally distributed, thereby facilitating wiring layout inside the substrate. Moreover, guard trace may form on each side of a signal trace so that cross talk between neighboring signal traces is prevented. With this arrangement, electrical performance of the die also improves.

To achieve these and other advantages and in accordance with the purpose of the invention, as embodied and broadly described herein, the invention provides a flip-chip die. The die has an active surface. The die further includes a plurality of core power/ground pads, at least one signal pad ring, at least one power pad ring and at least one ground pad ring on the active surface. The core power/ground pads are located in the central region of the die. The signal pad ring, the power pad ring and the ground pad ring surround the central core power/ground pad region concentrically.

This invention also provides a flip-chip package substrate having a plurality of wiring layers and insulation layers. The wiring layers and the insulation layers are alternately stacked such that each wiring layer is sandwiched between two insulation layers and vice versa. The insulation layer has through plugs for connecting the wiring layers electrically. The uppermost wiring layer in the substrate has a plurality of core power/ground bump pads, at least one signal bump pad ring, at least one power bump pad ring and at least one ground bump pad ring. The core power/ground bump pads are located in the central region of the substrate. The signal bump pad ring, the power bump pad ring and the ground bump pad ring surround the central core power/ground bump pad region concentrically.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 3A:
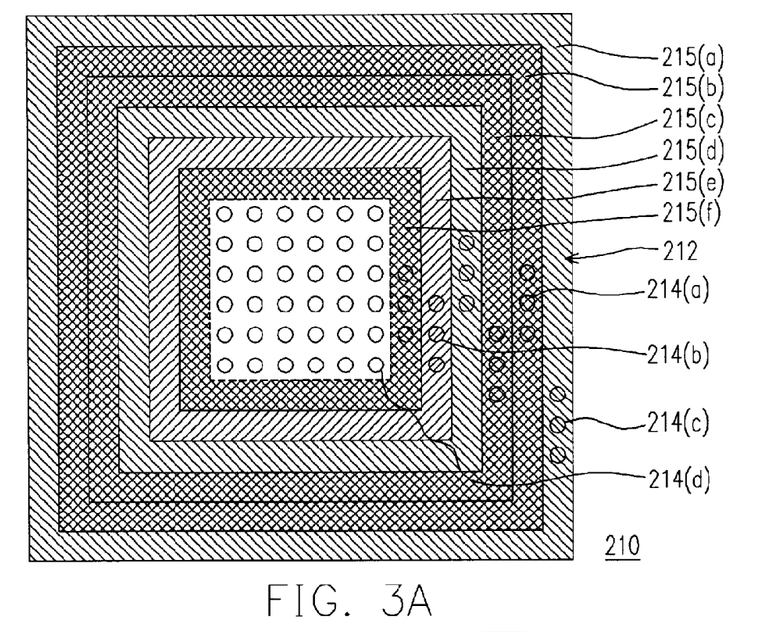
FIGS. 3A, 3C, 3E, 3G, 3I, 3K and 3M are top views of a die fabricated according to the preferred embodiments of this invention.

FIG. 3A is top view of a die fabricated according to the preferred embodiments of this invention. As shown in FIG. 3A, a plurality of die pads 214 (such as 214a, 214b, 214c, 214d, . . . ) are formed on the active surface 212 of a die 210 in the form of an area array. The die pads 214 are positioned inside various die pad rings 215. According to function, the die pads 214 may be divided into signal pads 214a, power pads 214b, ground pads 214c and core power/ground pads 214d. The signal pads 214a, the power pads 214b and the ground pads 214c surround the core power/ground pads 214. In other words, the signal pads 214a, the power pads 214b and the ground pads 214c are located at the peripheral region of the core power/ground pads 214d. Note that the die pads 214 within the signal pad ring (such as the second pad ring 215b, the third pad ring 215c and the sixth pad ring 215f) should include more than 50% of signal pads 214a. Ideally, more than 90% of the die pads 214 within the signal pad ring are signal pads 214a. The same applies to the die pads within the power pad ring (such as the fifth pad ring 215e) and the ground pad ring (such as the first pad ring 215a and the fourth pad ring 215d). In addition, each signal pad ring may include one, two, three or more ring layers each having a plurality of die pads 214 therein. For example, the second pad ring 215b and the third pad ring 215c in FIG. 3A may be regarded as a single signal pad ring. Similarly, the power pad ring and the ground pad ring may include one or more ring layers of die pads.

The multiple of pad rings 215 is concentrically positioned on the active surface 212 of the die 210. Each pad ring 215 may be set aside as a signal pad ring, power pad ring or ground pad ring. The die 210 in FIG. 3A includes three signal pad rings (the second pad ring 215b, the third pad ring 215c and the sixth pad ring 215f), a power pad ring (the fifth pad ring 215e) and two ground pad rings (the first pad ring 215a and the fourth pad ring 215d). The assignment in FIG. 3A is just one possible concentric arrangement of pad rings on the die 210. Other possible concentric arrangements of pad rings are shown in FIGS. 3C, 3E, 3G, 3I, 3K and 3M. However, the multi-function pad ring 215 structures are not restricted to the concentric ones shown in FIGS. 3A, 3C, 3E, 3G, 3I, 3K and 3M. Other concentric arrangement is also permissible in this invention. Note that the outermost ring or the sixth pad ring 215f can also be designed as a power pad ring or a ground pad ring so that signals transmitted through conductive wires are shielded.

In the preferred embodiment of this invention, die pads 214 having an identical function are grouped together to form a pad ring 215. Meanwhile, the power pads 214b within the power pad ring 215e may be electrically connected together through circuit wires. Furthermore, the ground pads 514b within the ground pad ring 215a (or the ground pad ring 215d) may also be electrically connected together through circuit wires. Hence, the power pads 214b and ground pads 214c referenced by various signal pads 214a are more standardized for a better electrical performance.

Figure 3B:
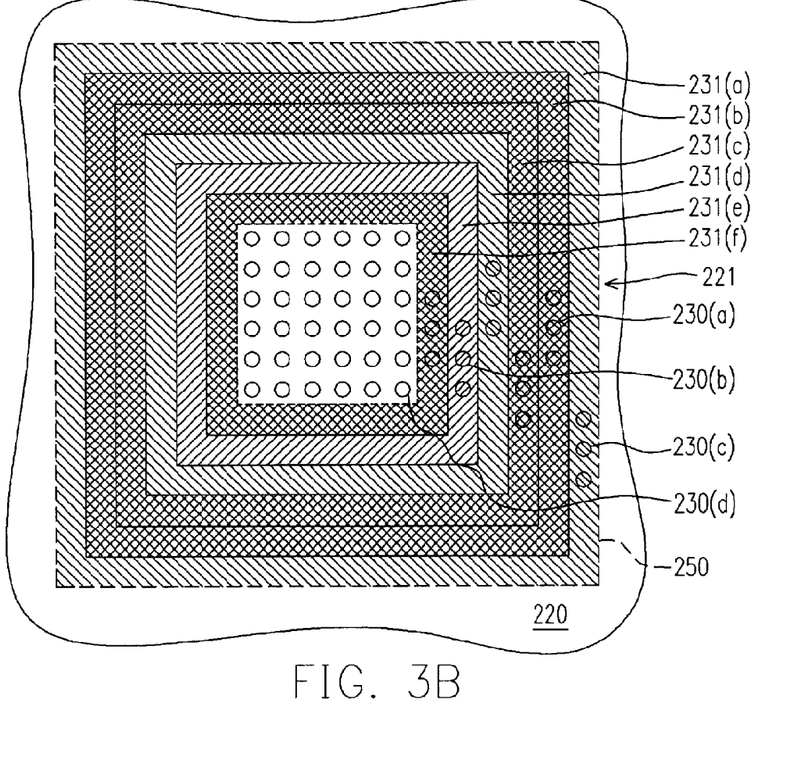
FIGS. 3B, 3D, 3F, 3H, 3J, 3L and 3N are top views of a portion of flip-chip package substrate fabricated according to the preferred embodiments of this invention.
Figure 3C:
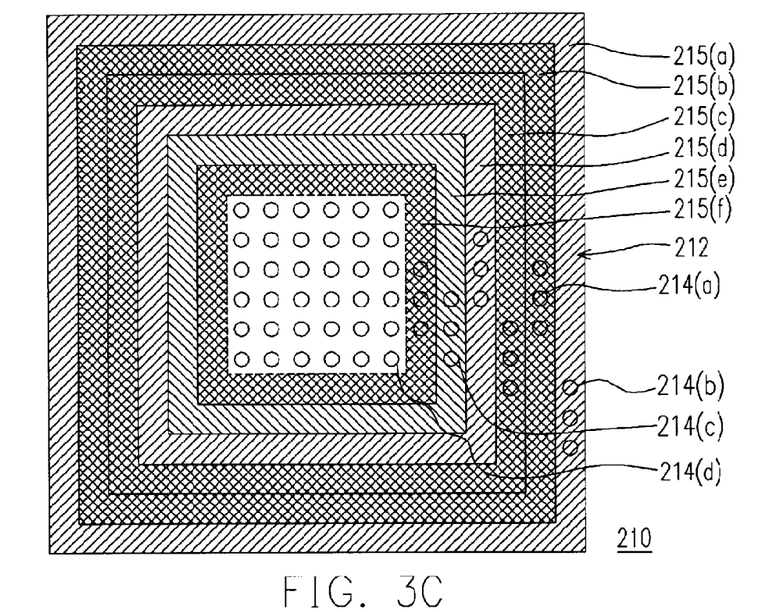
Figure 3D:
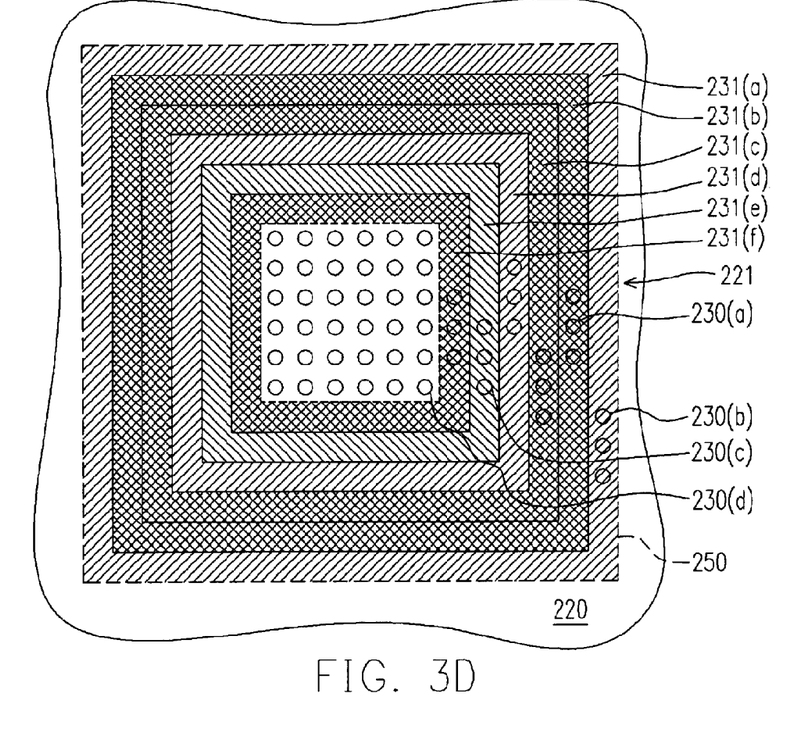
Figure 3E:
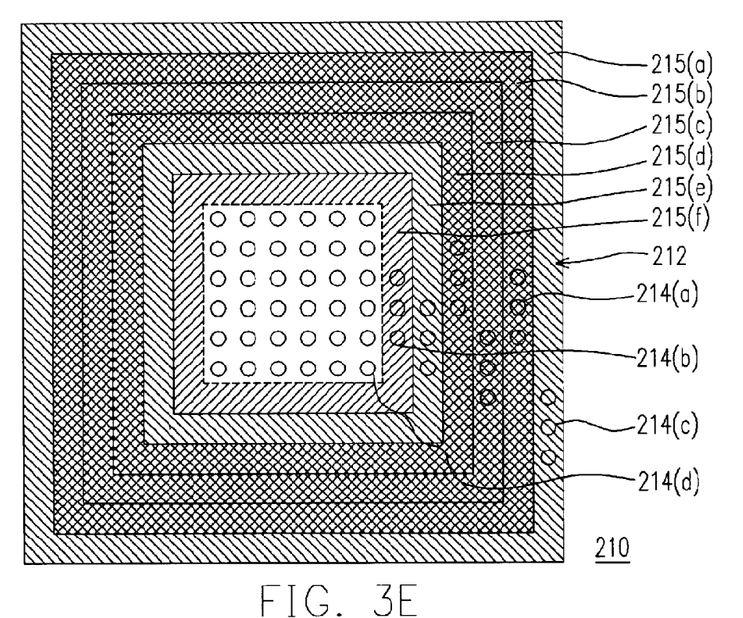
Figure 3F:
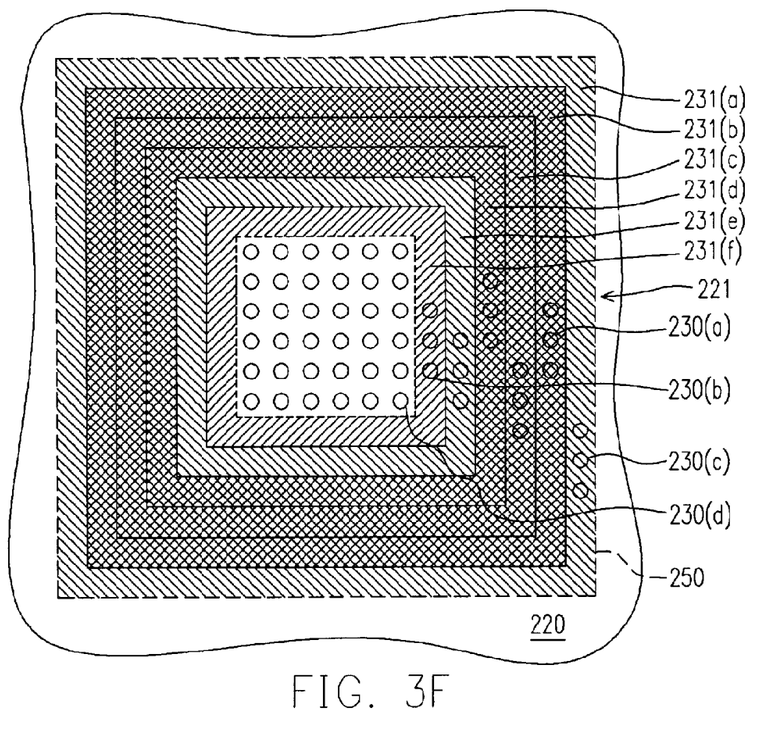
Figure 3G:
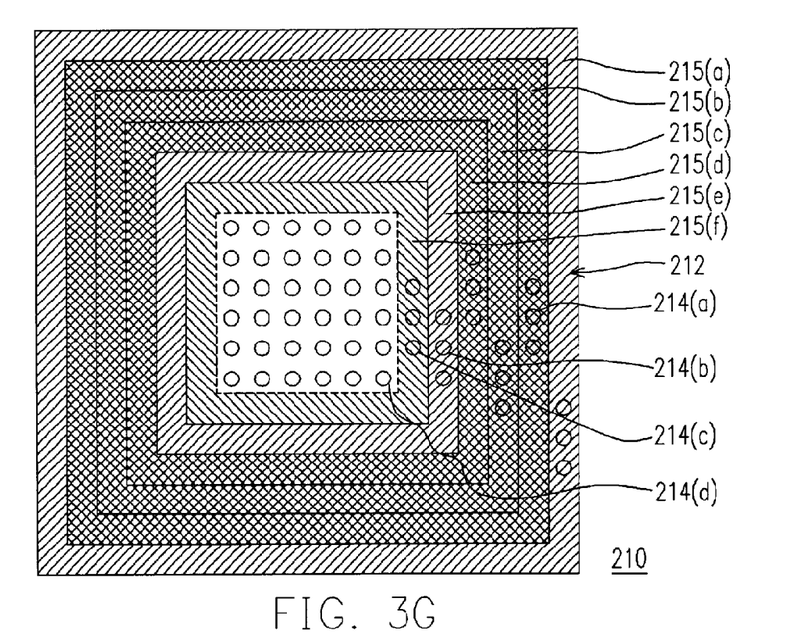
Figure 3H:
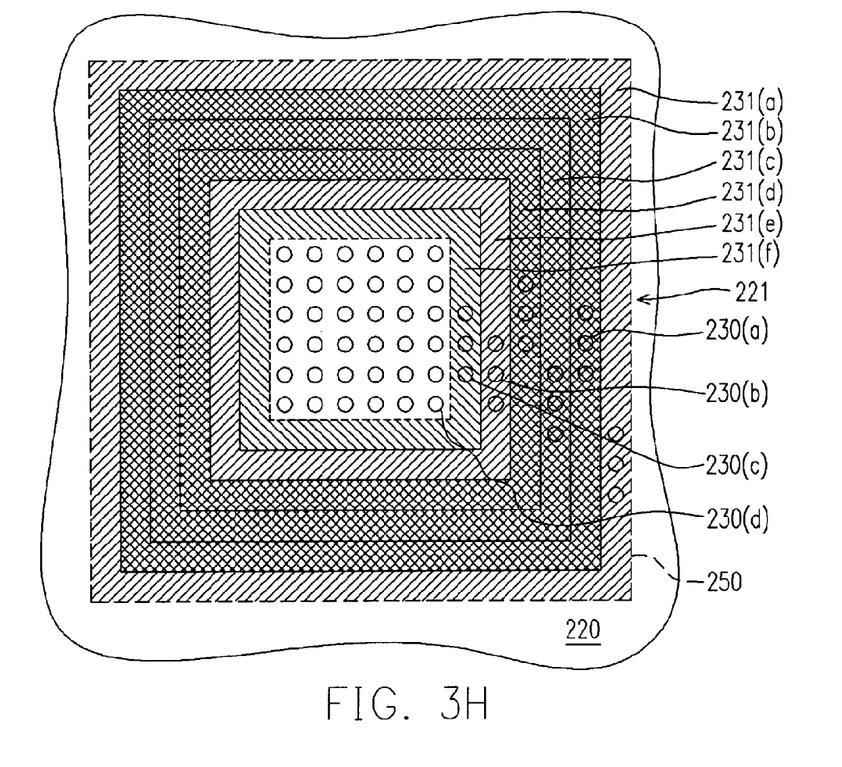
Figure 3I:
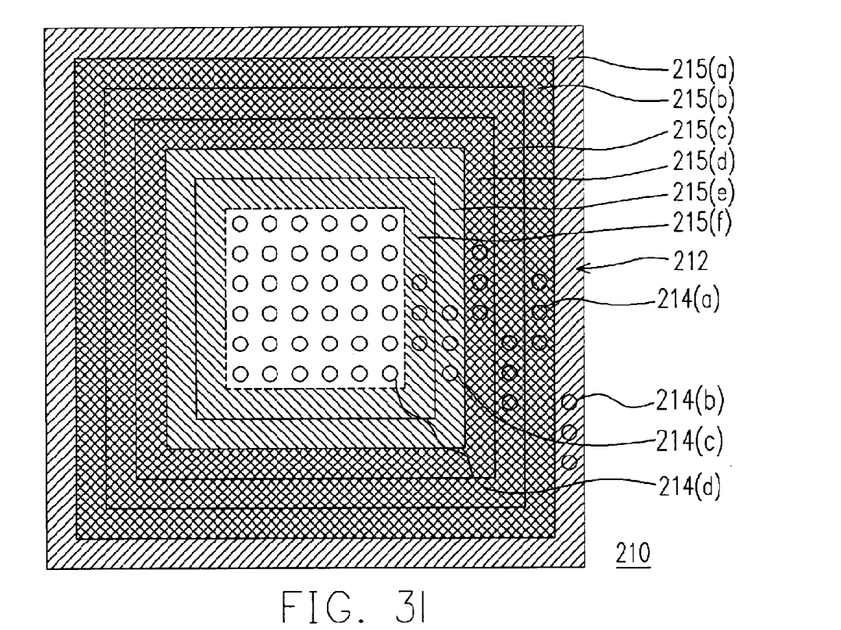
Figure 3J:
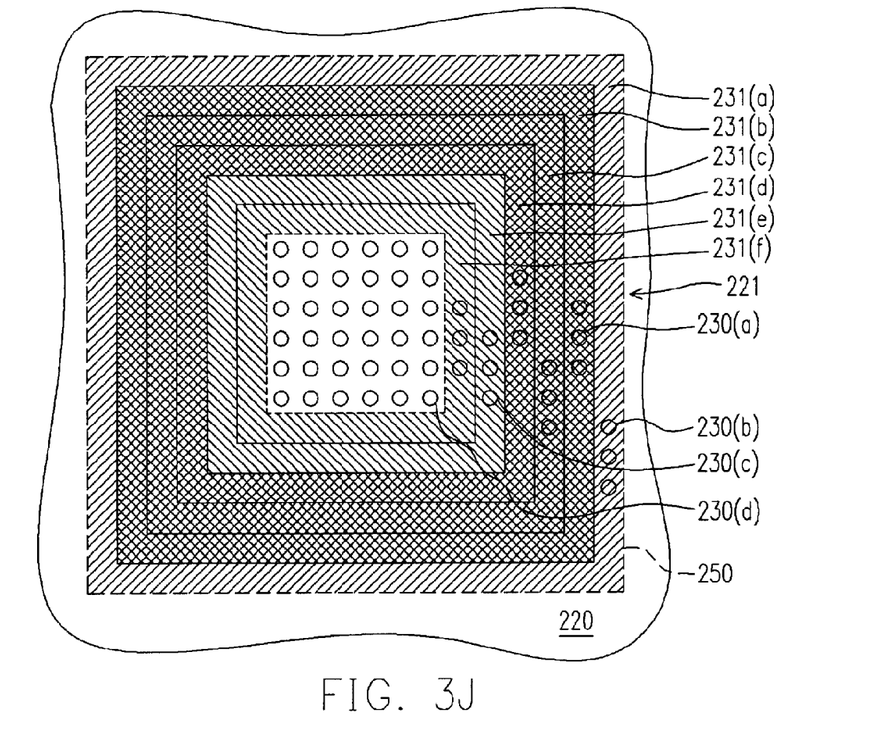
Figure 3K:
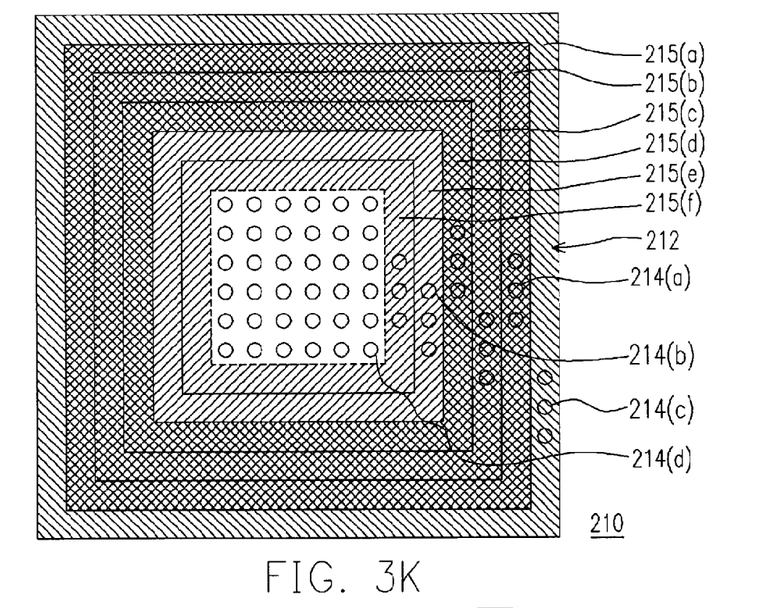
Figure 3L:
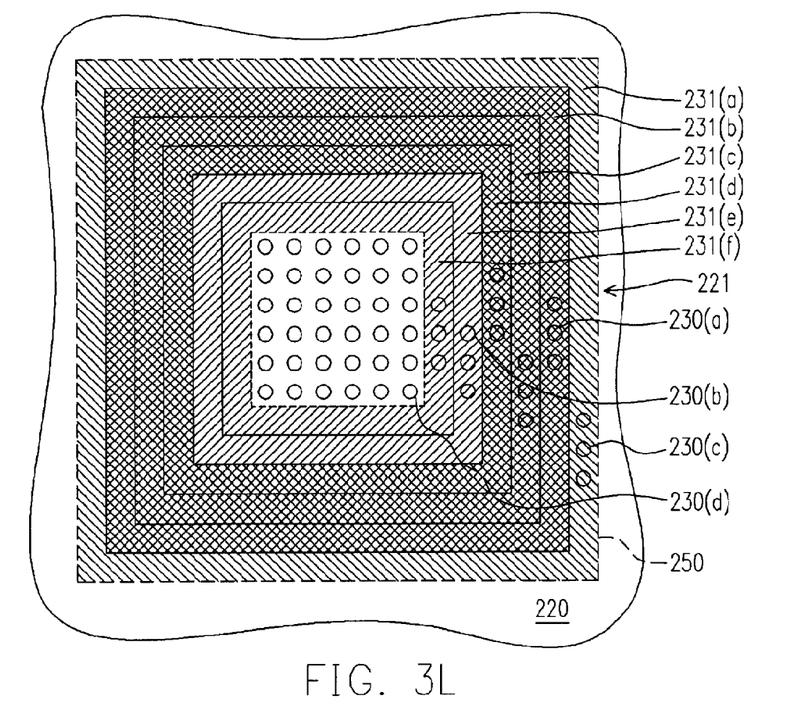
Figure 3M:
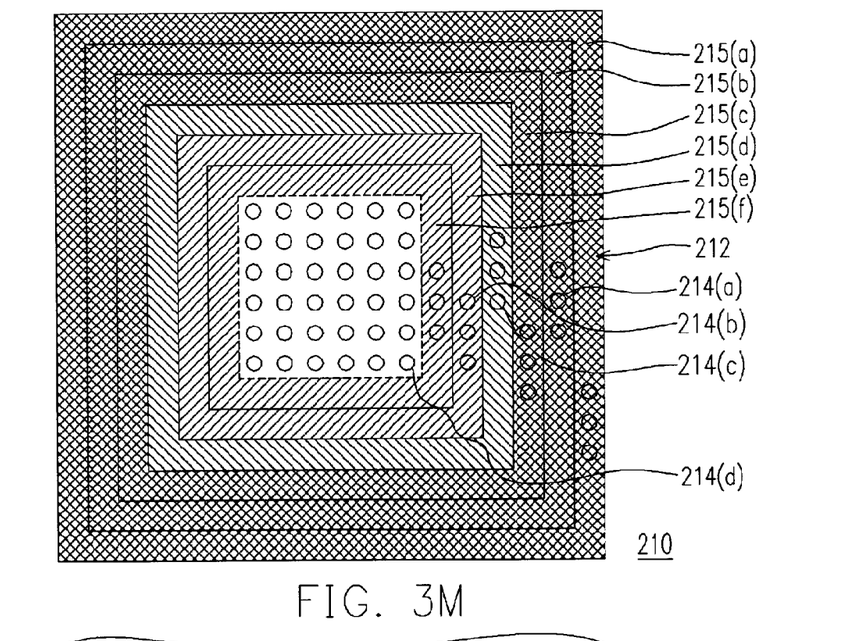
Figure 3N:
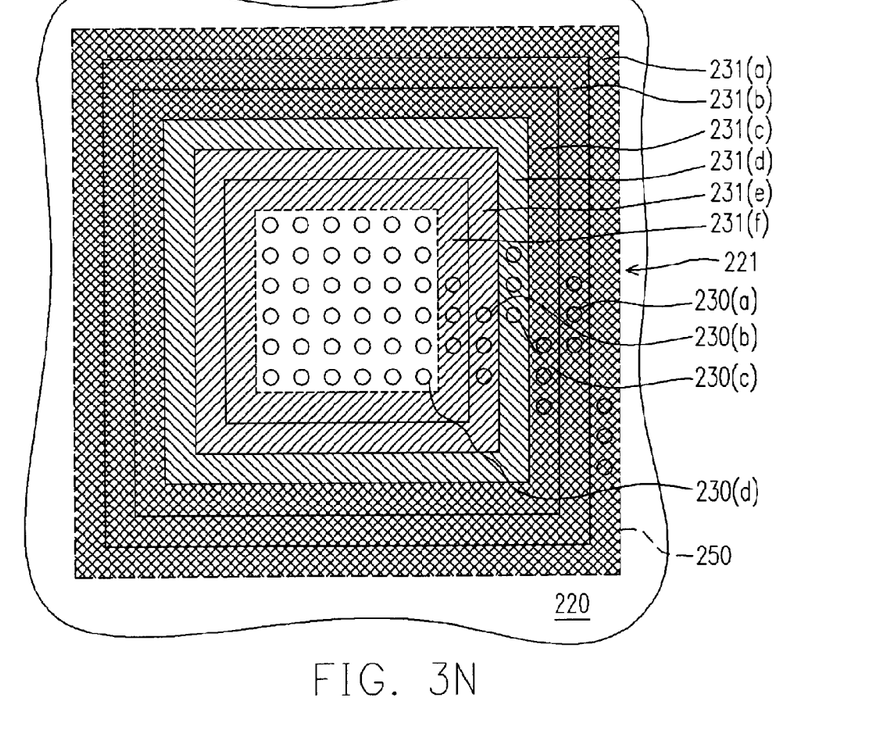

FIG. 3B is a top view of a portion of flip-chip package substrate fabricated according to the preferred embodiments of this invention that corresponds to the die in FIG. 3A. As shown in FIG. 3B, the flip-chip package substrate 220 is constructed from the same type of wiring layers 24 (including 24a, 24b, 24c, . . . ) and insulation layers 26 (including 26a, 26b, 26c, . . . ) as shown in FIG. 1. The wiring layers 24 and the insulation layers 26 are alternately stacked such that each wiring layer is sandwiched between two insulation layers and vice versa. In addition, the substrate 220 has through plugs 36 such as via plugs 36a and plating through holes 36b passing through the insulation layers 26 for connecting up neighboring wiring layers 24.

As shown in FIGS. 1 and 3B, the bump pads 230 (including 230a, 230b, 230c, ...) on the uppermost surface 221 of the substrate 220 is similar to the bump pads 30 in FIG. 1. In fact, the bump pads 230 are formed on the first wiring layer 24a of FIG. 1, which is the uppermost layer among the wiring layers 24. Each bump pad 30 corresponds in position to a die pad 14 so that the die pad 14 and the bump pad 30 on the substrate 20 can be electrically connected through a bump 16. Ultimately, through electrical structures such as the wiring layers 24 and plugs 36, a portion of the die pads 14 on the die 10 fans out to other areas underneath the active surface 12.

To facilitate the bonding with the die pads 214 on the die 210, the bump pads 230 on the substrate 220 are formed within the die area 250 on the uppermost surface 221 of the substrate 220. The bump pads 230 similarly have an area array pattern and the bump pads 230 together form a multiple of bump pad rings 231. According to the connection with a particular type of die pad, the bump pads 130 are further classified into signal bump pads 230a, power bump pads 230b, ground bump pads 230c and core power/ground bump pads 230d. The core power/ground pads 230d are located in the central region of the substrate 220. The signal bump pads 230a, the power bump pads 230b and the ground bump pads 230c are distributed around the core power/ground bump pads 230d just outside the central region. Note that the bump pads 230 within the signal bump pad ring (such as the second bump pad ring 231b, the third bump pad ring 231c and the sixth bump pad ring 231f) should include more than 50% of signal bump pads 230a. Ideally, more than 90% of the bump pads 230 within the signal bump pad ring are signal bump pads 230a. The same applies to the bump pads within the power bump pad ring (such as the fifth bump pad ring 231e) and the ground bump pad ring (such as the first bump pad ring 231a and the fourth bump pad ring 231d). In addition, each signal bump pad ring corresponds to a signal die pad ring in FIG. 3A. Each signal bump pad ring may include one, two, three or more ring layers each having a plurality of bump pads 230 therein. For example, the second bump pad ring 231b and the third bump pad ring 231c in FIG. 3B may be regarded as just one signal bump pad ring. Similarly, the power bump pad ring and the ground bump pad ring may include one or more rings of bump pads.

The assignment of the bump pad rings 231 on the substrate 220 in FIG. 3B is just one possible concentric arrangement. Other possible concentric arrangements of bump pad rings are shown in FIGS. 3D, 3F, 3H, 3J, 3L and 3N. However, the multi-function bump pad ring 231 structures are not restricted to the concentric ones shown in FIGS. 3B, 3D, 3F, 3H, 3J, 3L and 3N. Other concentric arrangement that corresponds to the distribution of die pads 214 on the die 210 is also permissible in this invention.

Figure 4A:
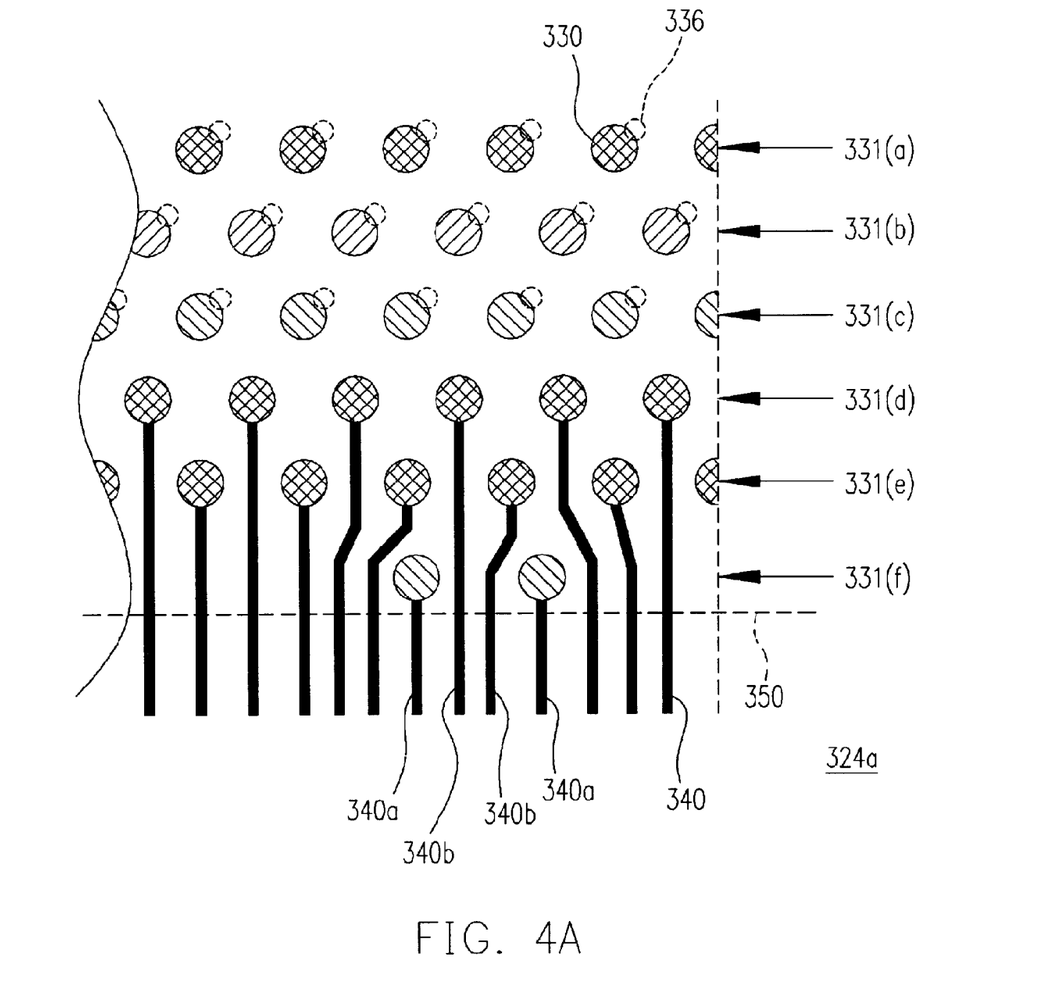
FIG. 4A shows a portion of the first wiring layer in the flip-chip package substrate shown in FIG. 3B.
Figure 4B:
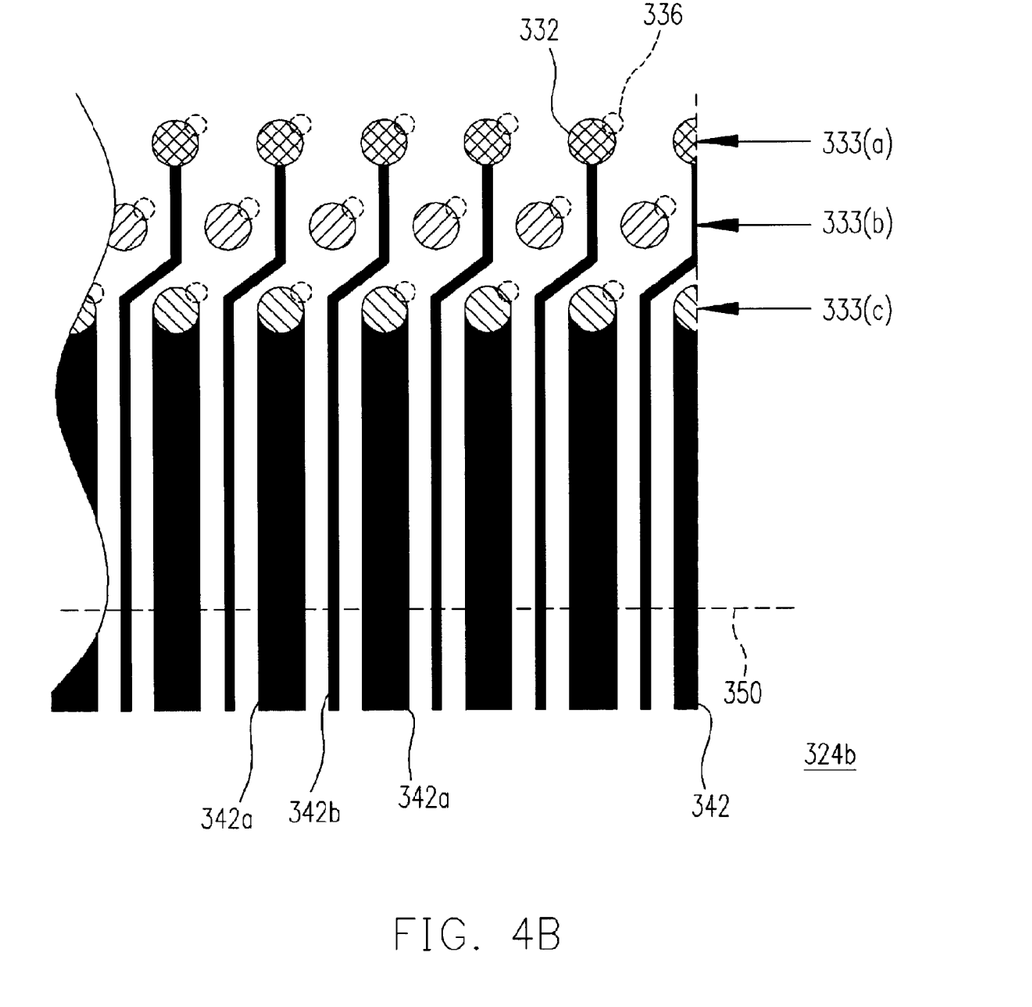
FIG. 4B shows a portion of the second wiring layer in the flip-chip package substrate shown in FIG. 3B.

FIGS. 4A and 4B are diagrams showing the layout of a portion of the first wiring layer and the second wiring layer in the flip-chip package substrate shown in FIG. 3B. The first wiring layer 324a (the first wiring layer 24a in FIG. 1) as shown in FIG. 4A has a plurality of bump pads 330 (the bump pads 30 in FIG. 1). The bump pads 330 are positioned concentrically within several bump pad rings 331 just like the bump pad rings 231 in FIG. 3B. In FIG. 4A, only a portion of the multi-ring structure is shown. All the bump pads 330 are located within the die region 350 (the die region 250 in FIG. 3B). Note that if the a flip-chip package substrate having six rings thereon like the one in FIG. 3B is used as an example, the six bump pad rings in FIG. 4A are a ground bump pad ring 331a, a signal bump pad ring 331b, a signal bump pad ring 331c, a ground bump pad ring 331d, a power bump pad ring 331e and a signal bump pad ring 331f.

The second wiring layer 324b (the second wiring layer 24b in FIG. 1) as shown in FIG. 4B has a plurality of via pads 332 (the via pads 32 in FIG. 1). The via pads 332 are located inside the die region 350 (the die region 250 in FIG. 1). The bump pads 330 of the first wiring layer 324a as shown in FIG. 4A are electrically connected to the via pads 332 of the second wiring layer 324b as shown in FIG. 4B through various plugs 336 (the plugs 36a in FIG. 1). Similarly, the via pads 332 on the second wiring layer 324b constitute a plurality of via pad rings 333. The via pad rings 333 that correspond to the signal bump pad ring 331a, the power bump pad ring 331b and the ground bump pad ring 331c of the first wiring layer 324a are the signal via pad ring 333a, the power via pad ring 333b and the ground via pad ring 333c.

As shown in FIG. 4A, the plurality of conductive trace lines 340 in the first wiring layer 324a fans out the bump pads 230 within the outer three bump pad rings 231 including the ground bump pad ring 231f, the signal bump pad ring 231e and the signal bump pad ring 231d to area outside the die region 350. A portion of the bump pads 230 within the inner three bump pad rings 231 including the ground bum pad rings 231c, the power bump pad ring 231b and the signal bump pad ring 231a are electrically connected to the via pads 332 of the underlying second wiring layer 300 (as shown in FIG. 4B) within the inner three rings including the ground via pad ring 333c, the power via pad ring 333b and the signal via pad ring 333a respectively. Thereafter, conductive trace lines 342 fan out the via pads 332 within the ground via pad ring 333c and the signal via pad ring 333a to area outside the die region 350.

The conductive trace lines 340 leading from the bump pads 330 inside the ground bump pad ring 331f serve as ground trace lines 340a while the conductive trace lines 340 leading from the bump pads 330 inside the signal bump pad ring 331d or 331e serve as signal trace lines 340b. Cross talk between neighboring signal trace lines 340b may be prevented by lining each signal trace line 340b by a pair of ground trace lines 340a (non-signal trace lines). The ground trace lines 340a serve as a pair of guard traces shielding the signal trace line 340b. Similarly, a pair of power trace lines (not shown) can also serve as a pair of guard traces around the signal trace line 340b. In addition, one or more signal trace lines 340b may be inserted between a pair of ground trace lines 340a as shown in FIG. 4A.

In FIG. 4B, a pair of conductive trace lines 342 (ground trace lines 342a) leading from via pads 332 inside the ground via pad ring 333c may line the sides of a conductive trace line 342 (signal trace line 342b) leading from via pads 332 inside the signal via pad ring 333a. In other words, a ground trace line 342a is positioned on each side of at least one signal trace line 342b to serve as a pair of guard traces that prevent cross talk between neighboring signal trace lines 342b. Similarly, a pair of power conductive trace lines 342 connected to a power terminal may serve as a pair of guard traces for the signal trace lines 342b. Note that the ground trace lines 342a serving as a guard trace may have a width greater than the signal trace line 342b so that resistance of the ground trace line 342a is lowered. Under the same token, width of ground trace line 340a that serves as a guard trace may be greater than the signal trace line 340a in FIG. 4A to reduce the resistance of ground trace lines 340a.

In summary, the die pads inside the flip-chip die of this invention are grouped together according to their function. The die pads are formed within a clearly demarcated set of rings on the flip-chip die so that overall wiring length of the re-distribution layer inside the die is reduced. This invention also provides a flip-chip package substrate that corresponds to the die pad distribution on the flip-chip die. The upper surface of the substrate has a plurality of bumps arranged into an area array pattern such that bump pads having an identical function are mostly grouped together within a bump pad ring. Furthermore, power trace lines or ground trace lines may be positioned on each side of a signal trace line to serve as a pair of guard traces. Ultimately, cross talk between neighboring signal trace lines is reduced and electrical performance of the die is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flip-chip package substrate, comprising:
   a plurality of wiring layers forming a stack and having an uppermost wiring layer, a bottommost layer, and at least one inner wiring layer;
   a plurality of insulation layers sandwiched between two neighboring wiring layers for isolating the wiring layers such that an insulation layer and a wiring layer stack on top of each other alternately; and
   a plurality of conductive plugs passing through the insulation layer for connecting the wiring layers electrically;
   wherein the uppermost wiring layer has a plurality of core power/ground bump pads, at least one signal bump pad rings, at least one power bump pad rings and at least one ground bump pad rings, the core power/ground pads are located in the central region of the die while the signal pad ring, the power pad ring and the ground pad ring are located outside the central power/ground pad region but concentric to the central power/ground pad region;
   wherein at least one non-signal bump pad ring encloses at least one signal bump pad ring; and
   wherein at least one inner wiring layer has at least one signal trace, and at least one guard traces and the guard trace is adjacent to the signal trace.

2. The flip-chip package substrate of claim 1, wherein the signal bump pad ring encloses a plurality of bump pads such that over 50% of the bump pads within the signal bump pad ring is signal bump pads.

3. The flip-chip package substrate of claim 1, wherein the signal bump pad ring encloses a plurality of bump pads and the bump pads are positioned as a multiple of rings.

4. The flip-chip package substrate of claim 1, wherein the power bump pad ring includes a plurality of bump pads such that over 50% of the bump pads within the power bump pad ring is power bump pads.

5. The flip-chip package substrate of claim 1, wherein the power bump pad ring encloses a plurality of bump pads and the bump pads are positioned as a multiple of rings.

6. The flip-chip package substrate of claim 1, wherein the ground bump pad ring includes a plurality of bump pads such that over 50% of the bump pads within the ground bump pad ring is ground bump pads.

7. The flip-chip package substrate of claim 1, wherein the ground bump pad ring encloses a plurality of bump pads and the bump pads are positioned as a multiple of rings.

8. The flip-chip package substrate of claim 1, wherein the guard trace is a power trace.

9. The flip-chip package substrate of claim 1, wherein the guard trace is a ground trace.

10. The flip-chip package substrate of claim 1, wherein the non-signal bump pad ring is a power bump pad ring.

11. The flip-chip package substrate of claim 1, wherein the non-signal bump pad ring is a ground bump pad ring.

12. A flip-chip package, comprising:
    a package substrate, comprising:
    a plurality of wiring layers forming a stack and having an uppermost wiring layer, a bottommost layer, and at least one inner wiring layer,
    a plurality of insulation layers sandwiched between two neighboring wiring layers for isolating the wiring layers such that an insulation layer and a wiring layer stack on top of each other alternately, and
    a plurality of conductive plugs passing through the insulation layer for connecting the wiring layers electrically,
    wherein the uppermost wiring layer has a plurality of core power/ground bump pads, at least one signal bump pad rings, at least one power bump pad rings and at least one ground bump pad rings, the core power/ground pads are located in the central region of the die while the signal pad ring, the power pad ring and the ground pad ring are located outside the central power/ground pad region but concentric to the central power/ground pad region,
    wherein at least one non-signal bump pad ring encloses at least one signal bump pad ring, and
    wherein at least one inner wiring layer has at least one signal trace, and at least one guard traces and the guard trace is adjacent to the signal trace; and
    a chip, electrically connected to the package substrate by flip-chip bonding.

13. The flip-chip package substrate of claim 12, wherein the signal bump pad ring encloses a plurality of bump pads such that over 50% of the bump pads within the signal bump pad ring is signal bump pads.

14. The flip-chip package substrate of claim 12, wherein the signal bump pad ring encloses a plurality of bump pads and the bump pads are positioned as a multiple of rings.

15. The flip-chip package substrate of claim 12, wherein the power bump pad ring includes a plurality of bump pads such that over 50% of the bump pads within the power bump pad ring is power bump pads.

16. The flip-chip package substrate of claim 12, wherein the power bump pad ring encloses a plurality of bump pads and the bump pads are positioned as a multiple of rings.

17. The flip-chip package substrate of claim 12, wherein the ground bump pad ring includes a plurality of bump pads such that over 50% of the bump pads within the ground bump pad ring is ground bump pads.

18. The flip-chip package substrate of claim 12, wherein the ground bump pad ring encloses a plurality of bump pads and the bump pads are positioned as a multiple of rings.

19. The flip-chip package substrate of claim 12, wherein the guard trace is a power trace.

20. The flip-chip package substrate of claim 12, wherein the guard trace is a ground trace.

21. The flip-chip package substrate of claim 12, wherein the non-signal bump pad ring is a power bump pad ring.

22. The flip-chip package substrate of claim 12, wherein the non-signal bump pad ring is a ground bump pad ring.

* * * * *